(12) United States Patent
Blashewski et al.

(10) Patent No.: US 7,719,849 B2
(45) Date of Patent: May 18, 2010

(54) MULTIPLE ACCESS TEST POINTS

(75) Inventors: Steven E. Blashewski, Duluth, GA (US); Robert R. Riggsby, Sandy Springs, GA (US); William G. Mahoney, Suwanee, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 984 days.

(21) Appl. No.: 11/482,435

(22) Filed: Jul. 7, 2006

(65) Prior Publication Data

US 2008/0007929 A1    Jan. 10, 2008

(51) Int. Cl.
*H05K 5/02* (2006.01)
(52) U.S. Cl. .................... 361/753; 361/752; 361/799; 361/730; 174/51; 174/50.52; 174/50; 439/76.1; 439/76.2
(58) Field of Classification Search ............. 361/753, 361/752, 799, 730, 822, 814; 439/76.1, 76.2; 174/50, 50.52, 51
See application file for complete search history.

(56) References Cited

U.S. PATENT DOCUMENTS

| | | | | |
|---|---|---|---|---|
| 5,252,916 A | * | 10/1993 | Swart | .................... 324/757 |
| 5,608,611 A | * | 3/1997 | Szudarek et al. | ............ 361/753 |
| 5,823,818 A | * | 10/1998 | Bell et al. | .................... 439/482 |
| 6,116,916 A | * | 9/2000 | Kasai | ........................ 439/76.2 |
| 6,184,460 B1 | * | 2/2001 | Bertoncini | .................. 174/359 |
| 6,606,252 B1 | * | 8/2003 | Snider | ........................ 361/777 |
| 7,149,089 B2 | * | 12/2006 | Blasko et al. | ............... 361/752 |
| 7,466,529 B2 | * | 12/2008 | Joung | ........................ 361/119 |

\* cited by examiner

*Primary Examiner*—Dameon E Levi
(74) *Attorney, Agent, or Firm*—Tarolli, Sundheim, Covell & Tummino LLP

(57) ABSTRACT

Included are systems and methods for providing access of test points. An embodiment of a system includes an electrical module including at least one electrical circuit configured to communicate at least one electrical signal, the electrical module further including at least one multiple access test point configured to provide access for measurements of the electrical circuit. Some embodiments include an environmental housing that includes at least one access port, the environmental housing configured to receive the electrical module such that at least one access port provides access to at least one multiple access test point.

17 Claims, 6 Drawing Sheets

MULTIPLE ACCESS TEST POINTS

TECHNICAL FILED

The present disclosure is related to providing access to a test point. More specifically, the present disclosure is related to providing a plurality of ways to access a test point.

BACKGROUND

Test points, including broadband test points, are provided in electrical circuits for use in setting up and troubleshooting cable distribution plants. These electrical circuits (including, but not limited to, radio frequency (RF) amplifiers and optical nodes) may be disposed in an environmental housing. The test points may be accessible from the top of the electrical circuit when the environmental housing is open. However, it may be desirable to access a test point without opening the equipment environmental housing.

In some environmental housings, accessibility to the test points may be provided through one or more apertures in the lid of the housing. The apertures (which may be referred to as test point access ports) may be located proximate to the positions of the test points of the electrical circuit. The access ports may be closed (e.g. with a plug, stopper, etc.) when not in use. During testing, the access port may be opened and a probe may be used to access the test point. However, in many circuits, power supplies and other modules that reside inside the environmental housing lid between the test point and access port may obstruct access to the test points.

One current solution can utilize flexible cable assemblies designed to provide probe access by coupling the flexible cable assembly with the test points and bypassing the obstructions by routing signals from the electrical circuit to access ports located on the sides of the environmental housing lid. While such a solution may provide unobstructed access to a test point, positioning these cable assemblies over the electrical circuits can produce grounding, isolation, and test point response problems during use. In addition, use of these cable assemblies may complicate the installation of the electrical circuits, thus increasing the expense to manufacture and install the units.

Thus, a heretofore unaddressed need exists in the industry to address the aforementioned deficiencies and inadequacies, among others.

BRIEF DESCRIPTION

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, there is no intent to limit the disclosure to the embodiment or embodiments disclosed herein. On the contrary, the intent is to cover all alternatives, modifications, and equivalents.

DETAILED DESCRIPTION

Figure 1B:
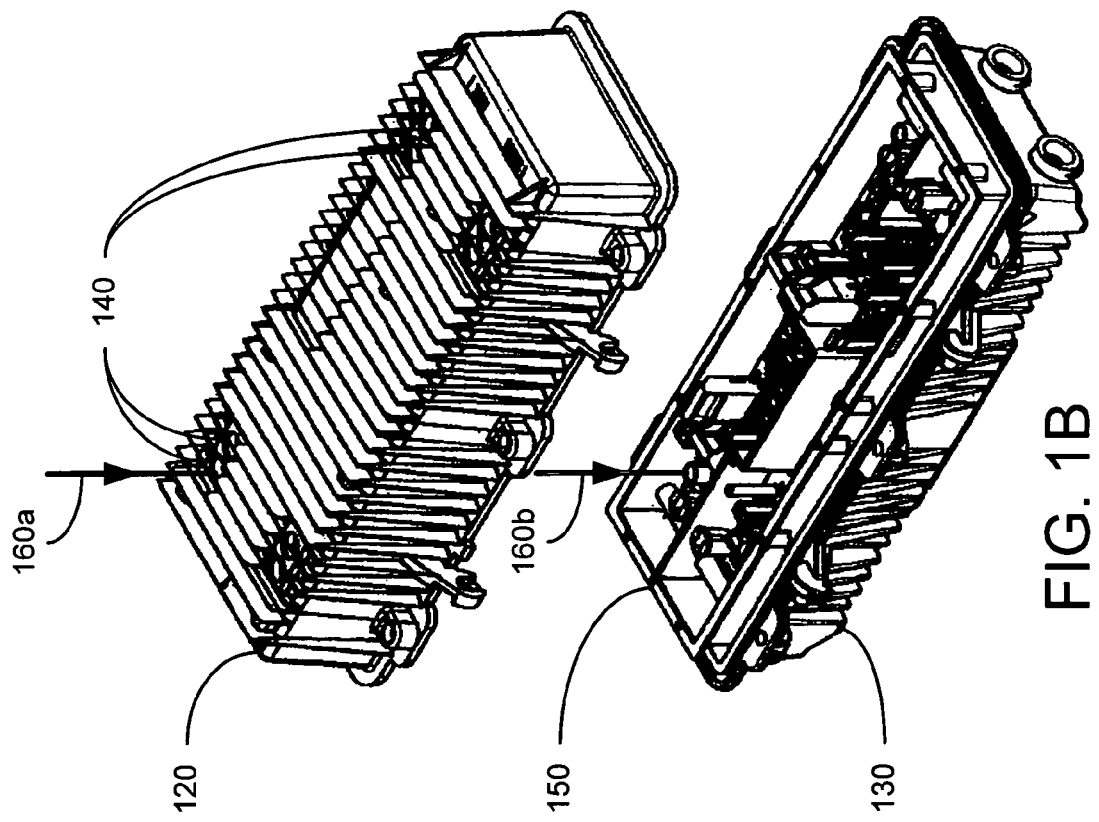
FIG. 1B is an illustration of the exemplary electrical unit of FIG. 1A in a second open position.
Figure 1A:
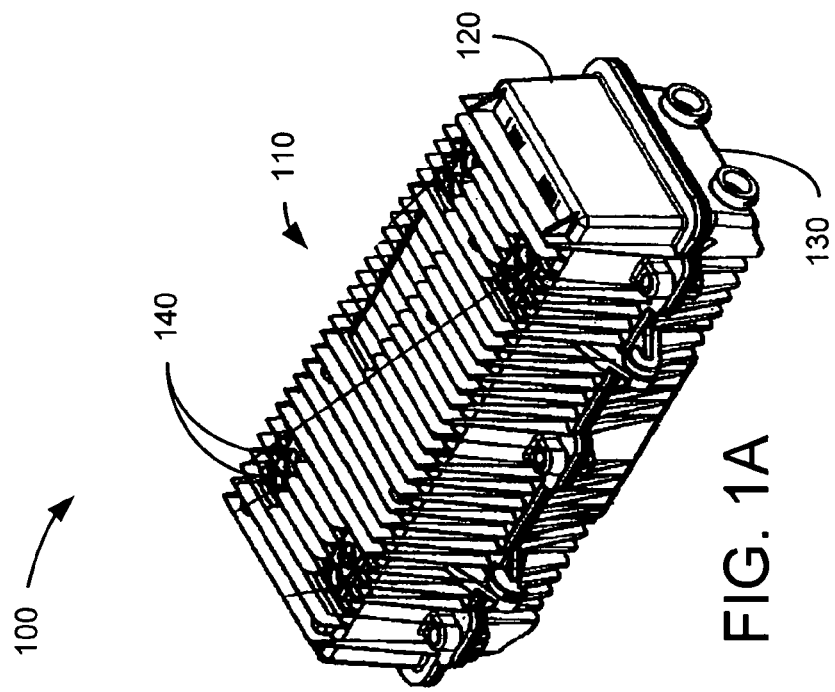
FIG. 1A is an illustration of an exemplary electrical unit in a first closed position.

FIGS. 1A and 1B are illustrations of an exemplary electrical unit 100 depicted in a first closed position and a second open position, respectively. The electrical unit 100 may be configured to include an environmental housing 110 and an electrical module 150 disposed in the environmental housing 110. The environmental housing 110 may include a housing lid 120, a housing base 130, and/or one or more test point access ports 140. The test point access ports 140 may be configured as apertures in the environmental housing 110 to provide access (as illustrated by arrows 160a and 160b) to an electrical circuit included in the electrical module 150. Test point access ports 140 may be located, among other locations, in the housing lid 120, the housing base 130, and permutations thereof. One should note that in some embodiments, among others, the apertures can be configured to receive a closing device, such as, but not limited to, a plug, cork, stopper, etc. Closing the aperture can help maintain the integrity of the environmental housing 110 by reducing the amount of dirt, moisture, etc. that can pass into the environmental housing 110 through the test point access port 140.

Figure 2:
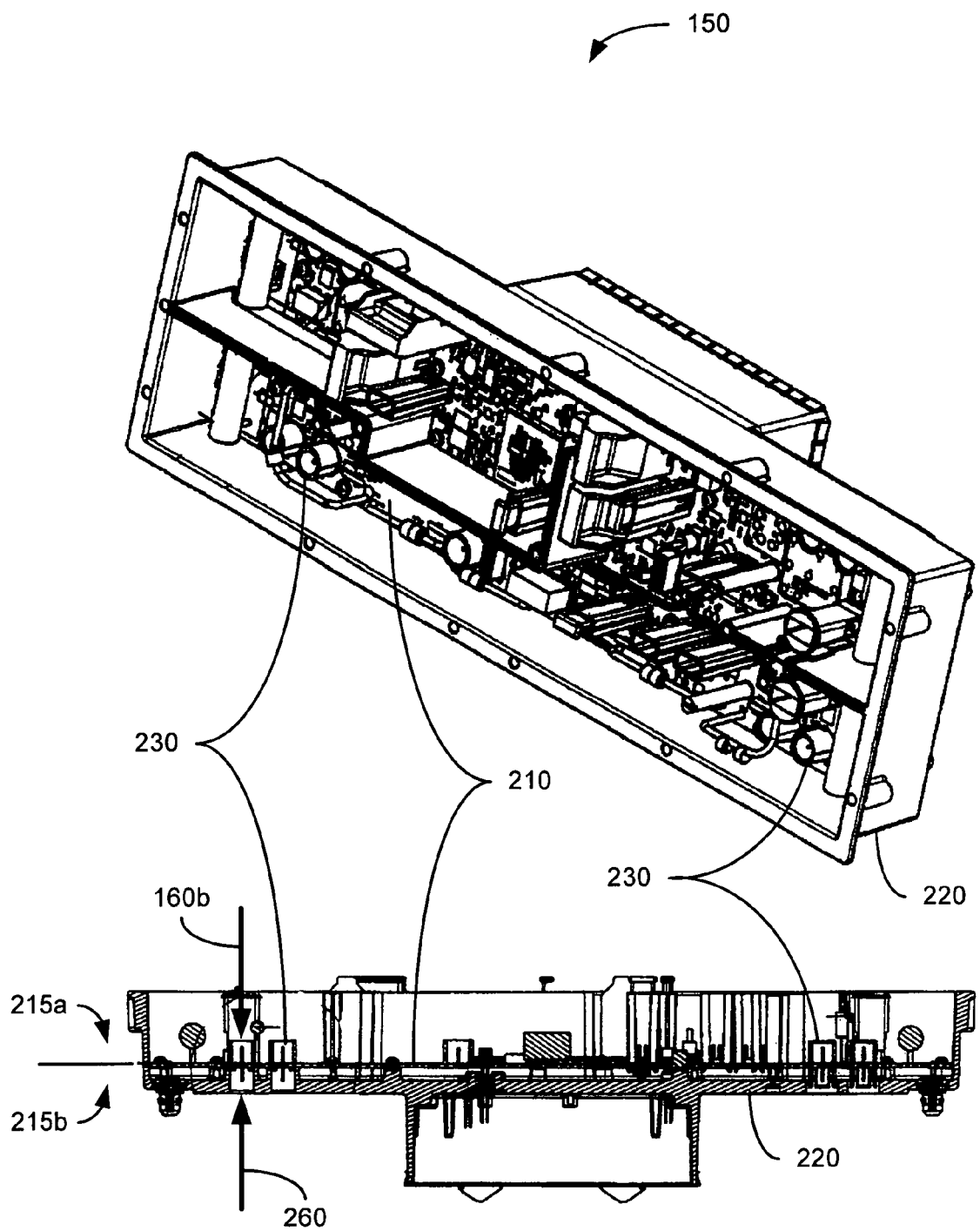
FIG. 2 is an illustration of an exemplary electrical module included in the electrical unit from FIG. 1.

FIG. 2 is an illustration of the exemplary electrical module 150 included in the electrical unit 100 from FIG. 1. The electrical module 150 may include electrical circuits configured to communicate at least one electrical signal, such as, but not limited to, in a radio frequency (RF) amplifier and/or optical node. In at least one non-limiting embodiment, among others, the electrical module 150 may include a circuit board 210 including a first side 215a and a second side 215b, a module chassis 220, and one or more test points 230. The circuit board 210 can include, but is not limited to, a printed circuit including traces, connections and components for implementing at least a portion of the electrical circuit of the electrical module 150. Other embodiments can include a plurality of circuit boards configured to implement at least a portion of the electrical circuit of the electrical module 150. One or more circuit boards 210 can be coupled to the module chassis 220 for installation in the environmental housing 110. The module chassis 220 may be configured to allow removal of the electrical module 150 from the environmental housing 110 for repair or replacement. Another non-limiting embodiment, among others, can incorporate one or more circuit boards 210 coupled to one or more module chassis 220. While element 220 is referred to herein as a module chassis, this is a non-limiting embodiment. More specifically, any chassis and/or other component can be utilized to provide the desired functionality.

According to some embodiments, test points 230 include a circuit connection and at least one ground contact, and can be electrically connected to the circuit board 210 to allow measurement of characteristics and signals, such as, but not limited to, resistances, alternating current (AC) signals, RF signals, etc., of the electrical circuit. The test points 230 can be configured to provide single and/or multiple points of access for measurements. The test point access ports 140 (FIG. 1) in the environmental housing 110 may provide access to one or more test points 230 while the environmental housing 110 remains closed. A test point probe (and/or other testing equipment) can be inserted (illustrated as arrow 160*a* in FIG. 1) via a test point access port 140 to reach (arrow 160*b* in FIGS. 1 and 2) one or more test points 230 on the circuit board 210.

One should note that components, such as wiring, power supplies, and other modules, may reside within the environmental housing lid 120 (FIG. 1), or elsewhere within the housing 110, between the test points 230 and access ports 140. Depending on the particular configuration, the components may prevent access (arrow 160*b*) to one or more test points 230 via a test point access port 140. To allow for multiple access paths (arrows 160*b* and 260 in FIG. 2) to a test point 230, at least one test point access port 140 may be incorporated into the housing lid 120 and at least one test point access port 140 may be incorporated into the housing base 130 (FIG. 1).

Figure 3:
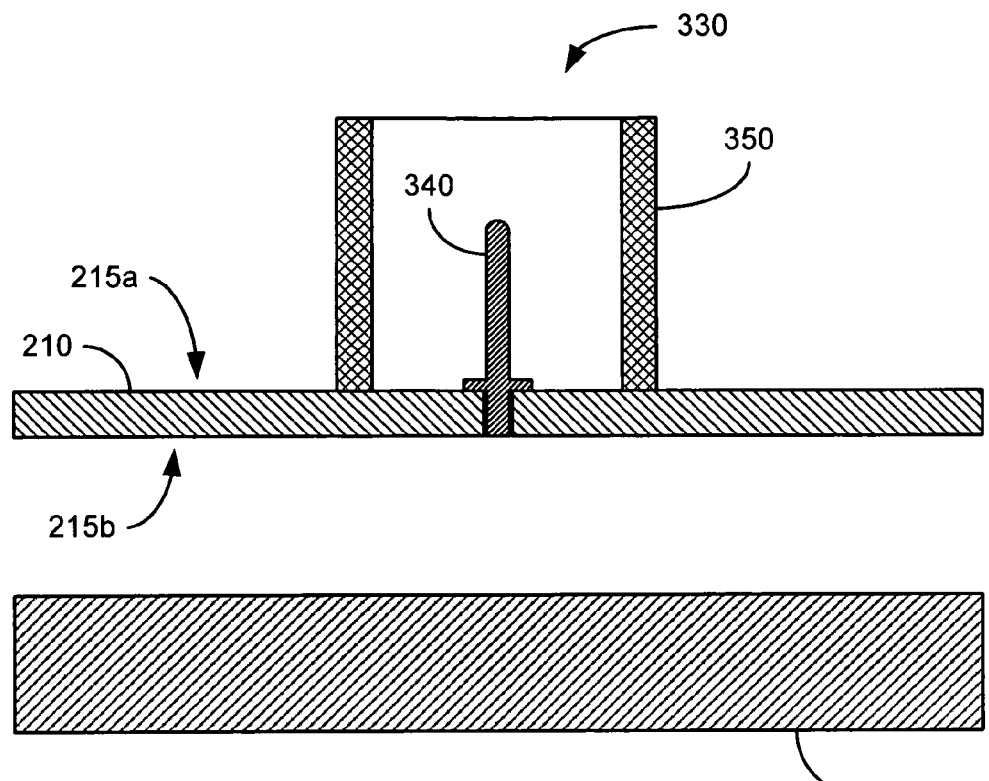
FIG. 3 is a diagram of an exemplary single access test point suitable for use in the electrical module from FIG. 2.

FIG. 3 is a diagram of an exemplary single access test point 330 suitable for use in the electrical module 150 from FIG. 2. A single access test point 330 can be configured to include a circuit connection and a ground contact. The circuit connection can include, but is not limited to, a connection pin 340, socket, spring contact, etc. A grounding can 350 may be configured to provide a ground contact for a test point probe. The connection pin 340 can be electrically connected to the circuit board 210 and configured to provide access for measurement of a signal and/or one or more electrical circuit characteristics such as, but not limited to, resistance, voltage, alternating current, direct current, RF signals, control signals, etc. The connection pin 340 and grounding contact of a single access test point 330 may be electrically connected to a first side 215*a* of the circuit board 210.

The circuit board 210 can be coupled to the module chassis 220 and disposed in the environmental housing 110, such that the first side 215*a* of the circuit board 210 faces the housing lid 120 (FIG. 1). In this configuration, the connection pin 340 and grounding can 350 may extend toward the housing lid 120. This arrangement can provide access to the single sided test point 330 when the housing lid 120 is open, as well as provide access to the test point 330 via test point access ports 140 when in the housing lid 120 is closed. However, as discussed previously, access through the test point access ports 140 may be obstructed by other components residing inside the housing lid 120 or elsewhere within the housing 110.

Figure 4:
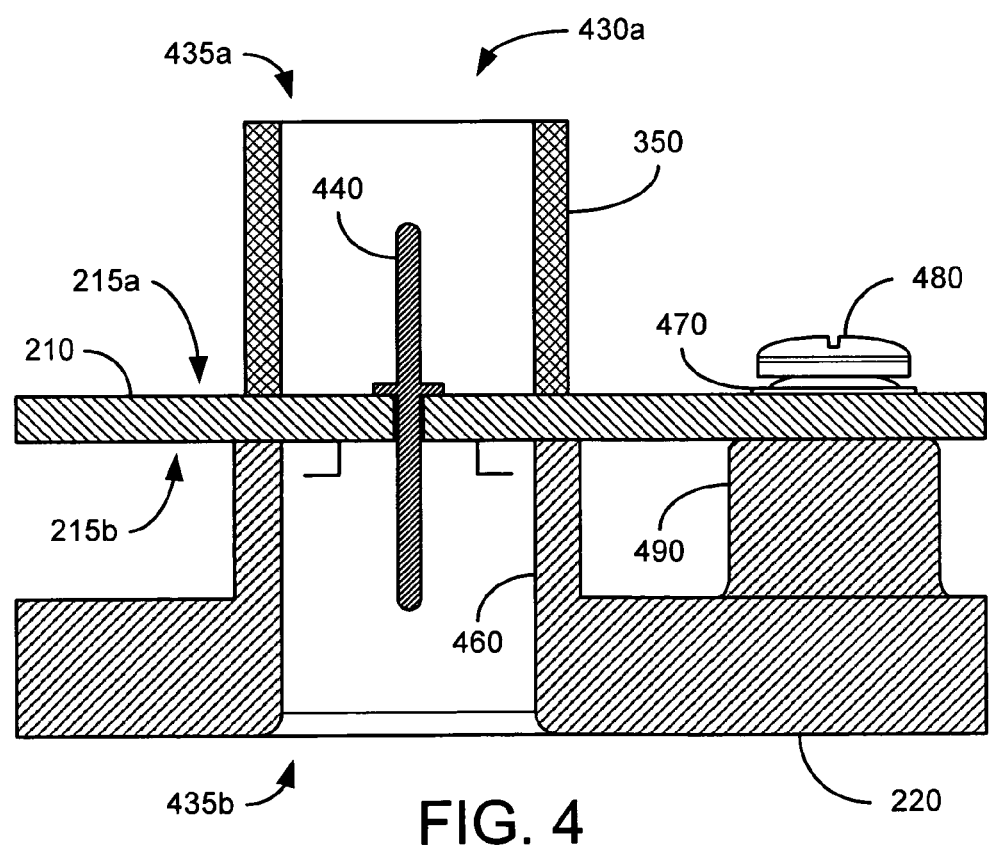
FIG. 4 is a side view of an embodiment of an exemplary multiple access test point with a ground contact provided by a module chassis, suitable for use in an electrical module similar to the embodiment from FIG. 3.

FIG. 4 is an embodiment of an exemplary multiple access test point 430*a* with a ground contact provided by a module chassis 220, suitable for use in an electrical module 150 similar to the embodiment from FIG. 3. A multiple access test point 430*a* can be configured to include a circuit connection. The circuit connection can include, but is not limited to, a connection pin 440, socket, etc. that is electrically connected to the circuit board 210. As illustrated in FIG. 4, the test point 430*a* may be configured to protrude from both the first side 215*a* and the second side 215*b* of the circuit board 210. The circuit board 210 may be coupled to a module chassis 220 and disposed in an environmental housing 110 (illustrated in FIG. 1) such that the first side 215*a* faces the housing lid 120 and the second side 215*b* faces the housing base 130. In this configuration, the connection pin 440 can extend toward both the housing lid 120 and housing base 130. In other embodiments, one or more circuit boards 210 may be coupled to the module chassis 220 in any of a plurality of orientations.

The multiple access test point 430*a* may also be configured to include ground contacts on the first side 215*a* and/or second side 215*b* of the circuit board 210. A grounding can 350, electrically connected to the first side 215*a* of the circuit board 210 facing the housing lid 120, may be configured to provide a ground contact as described in reference to the access test point 330 of FIG. 3. The second ground contact, located on the second side 215*b* of the circuit board 210 facing the housing base 130, may be provided by the module chassis 220. In this non-limiting embodiment, the module chassis 220 is configured such that, when coupled to the circuit board 210, a chassis ground contact 460 is substantially aligned with the portion of the connection pin 440 extending from the second side 215*b* of the circuit board 210. Electrically connecting the module chassis 220 to a ground circuit 470 of the circuit board 210 can provide continuity of ground contacts on the first side 215*a* and second side 215*b* of the circuit board 210. Fasteners 480 (which may include screws, rivets, pins, etc.) may be utilized to electrically connect the ground circuit 470 to connection posts 490 included on the module chassis 220.

A first side 435*a* of the multiple access test point 430*a*, extending from the first side 215*a* of the circuit board 210, may be accessed when the housing lid 120 is open and/or via a test point access port 140 in the housing lid 120 when the lid 120 is closed. As discussed with reference to the access test point 330 of FIG. 3, access to the first side 435*a* of the multiple access test point 430*a* via the test point access port 140 may be obstructed by components residing inside the housing lid 120 or elsewhere within the housing 110. Access to a second side 435*b* of the multiple access test point 430*a*, extending from the second side 215*b* of the circuit board 210, may be provided via a test point access port 140 in the housing base 130 that may be substantially aligned with the connection pin 440 and the chassis ground contact 460 of the test point 430*a*. One or more of the test point access ports 140 can be opened to provide test probe access to one or more multiple access test points 430*a* without opening the environmental housing 110.

Figure 5:
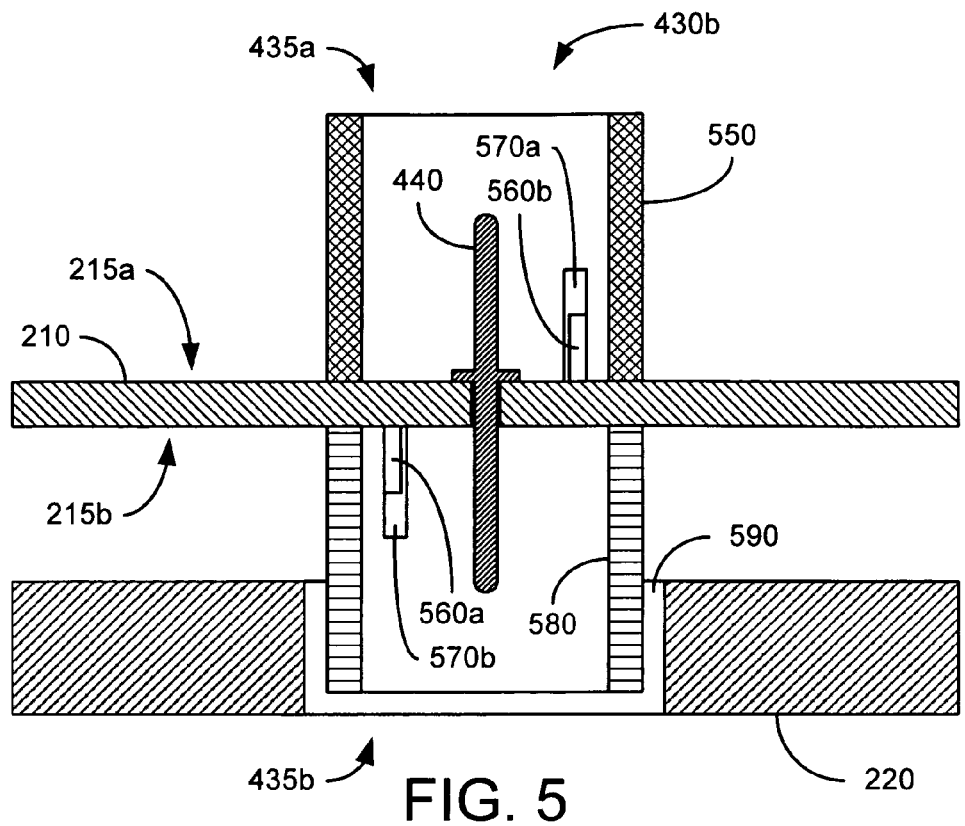
FIG. 5 is a side view of an embodiment of an exemplary multiple access test point with a ground contact provided by a second grounding can, suitable for use in an electrical module similar to the embodiment from FIG. 4.

FIG. 5 is an embodiment of an exemplary multiple access test point 430*b* with a ground contact provided by a second grounding can 580, suitable for use in an electrical module 150 similar to the embodiment from FIG. 4. In at least one non-limiting embodiment, among others, the multiple access test point 430*b* may be configured to include a circuit connection. The circuit connection can include, but is not limited to, a connection pin 440, socket, spring contact, etc. that is electrically connected to the circuit board 210 such that it extends from both the first side 215*a* and the second side 215*b* of the circuit board 210. When the circuit board 210 is coupled to a module chassis 220 and disposed in an environmental housing 110 (illustrated in FIG. 1) such that the first side 215*a* faces the housing lid 120 and the second side 215*b* faces the housing base 130, the connection pin 440 may extend toward both the housing lid 120 and housing base 130. In other embodiments, one or more circuit boards 210 may be coupled to the module chassis 220 in any of a plurality of orientations.

The multiple access test point 430*b* can be configured to include ground contacts on the first side 215*a* and/or second side 215*b* of the circuit board 210. In at least one non-limiting embodiment, among others, the ground contact on the first side 215*a* of the circuit board 210 may be provided using a first grounding can 550 configured with one or more legs 560a and slots 570a distributed around one edge of the grounding can 550. When electrically connected to the first side 215a of the circuit board 210, one or more legs 560a of the first grounding can 550 may be configured to extend through the circuit board 210 and protrude from the second side 215b. The ground contact on the second side 215b of the circuit board 210 may be provided by the second grounding can 580 with the same arrangement of one or more legs 560b and slots 570b described for the first grounding can 550. This second grounding can 580 may be electrically connected to the second side 215b of the circuit board 210 such that one or more legs 560b may extend through the system circuit board 210 and protrude from the first side 215a into one or more slots 570a of the first grounding can 550. Similarly, one or more legs 560a of grounding can 550 may protrude into the slots 570b of the second grounding can 580. This arrangement of intermeshing legs 560 and slots 570 can provide continuity of the ground contacts on the first side 215a and second side 215b of the circuit board 210. According to some embodiments, grounding cans 550 and 580 may also include a raised edge that can provide clearance between the circuit board 210 and the edge of the grounding cans 550 and 580 adjacent to the system circuit board 210. Such a configuration can allow electrical traces to be routed to the connection pin 440 under either grounding can 550 or 580.

As discussed in reference to the access test point 430a of FIG. 4, the first side 435a of the multiple access test point 430b may be accessed when the housing lid 120 (FIG. 1) is open and/or via a test point access port 140 in the housing lid 120 when the lid 120 is closed. Access to the second side 435b of the multiple access test point 430b may be provided via an opening 590 through the module chassis 220 and a test point access port 140 in the housing base 130 that may be substantially aligned with the second side 435b of the test point 430b. One or more of the test point access ports 140 can be opened to provide test probe access to the multiple access test point 430b without opening the environmental housing 110.

Figure 6:
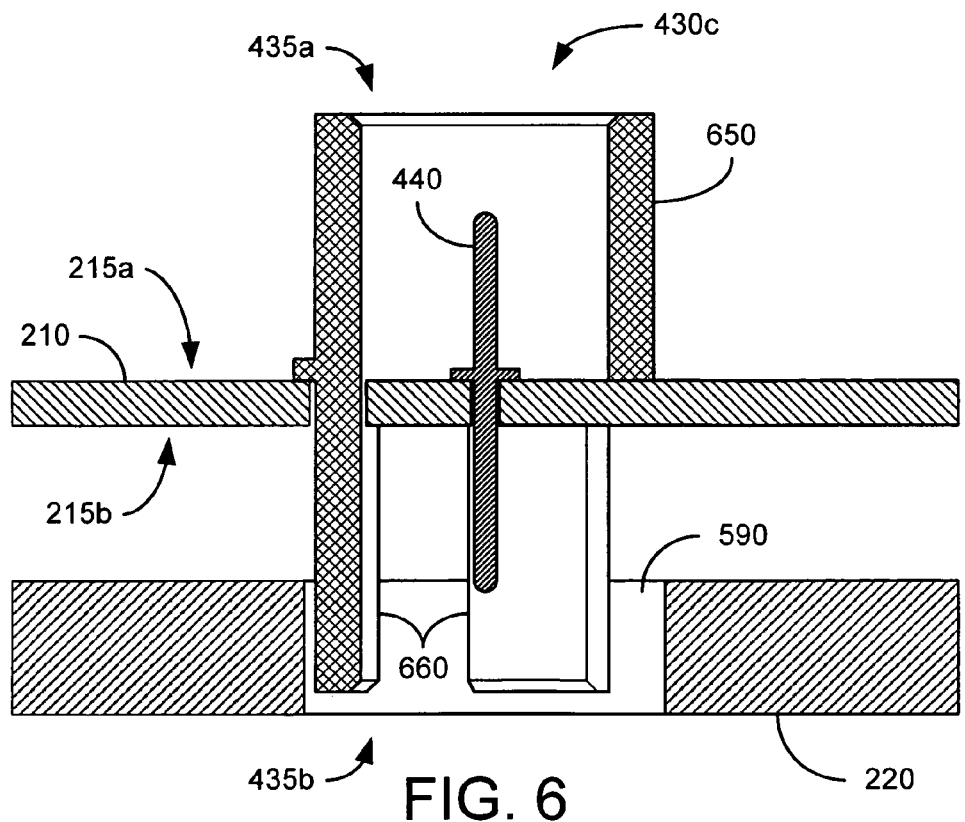
FIG. 6 is a side view of an embodiment of an exemplary multiple access test point with a ground contact provided by grounding can extensions, suitable for use in an electrical module similar to the embodiment from FIG. 5.

FIG. 6 is an embodiment of an exemplary multiple access test point 430c with a ground contact provided by grounding can extensions 660, suitable for use in an electrical module 150 similar to the embodiment from FIG. 5. In at least one non-limiting embodiment, among others, the multiple access test point 430c may be configured to include a circuit connection. The circuit connection can include, but is not limited to, a connection pin 440, socket, etc. that is electrically connected to the circuit board 210 such that it extends from the first side 215a and second side 215b of the circuit board 210. When the circuit board is coupled to a module chassis 220 and disposed in an environmental housing 110 (illustrated in FIG. 1) such that the first side 215a faces the housing lid 120 and the second side 215b faces the housing base 130, the connection pin 440 may extend toward both the housing lid 120 and housing base 130. Similarly, in some embodiments, one or more circuit boards 210 may be coupled to the module chassis 220 in any of a plurality of orientations.

Additionally, in at least one non-limiting embodiment, among others, ground contacts may be provided on the first side 215a and/or second side 215b of the circuit board 210 using a grounding can 650 configured with a plurality of grounding extensions 660 distributed around one edge of the grounding can 650. When electrically connected to the first side 215a of the circuit board 210, the grounding extensions 660 of the grounding can 650 can extend through and protrude from the second side 215b of the circuit board 210 to provide ground contact on the second side 215b. This arrangement of grounding extensions 660 can provide continuity of the ground contacts on the first side 215a and second side 215b of the circuit board 210.

As discussed in reference to the access test point 430b of FIG. 5, the first side 435a of the multiple access test point 430c, extending from the first side 215a of the circuit board 210, may be accessed when the housing lid 120 is open and/or via a test point access port 140 in the housing lid 120, when the lid 120 is closed. Access to the second side 435b of the multiple access test point 430c may be provided via an opening 590 through the module chassis 220 and a test point access port 140 in the housing base 130 that may be substantially aligned with the second side 435b of the test point 430c. One or more of the test point access ports 140 can be opened to provide test probe access to the multiple access test point 430c without opening the environmental housing 110.

Figure 7:
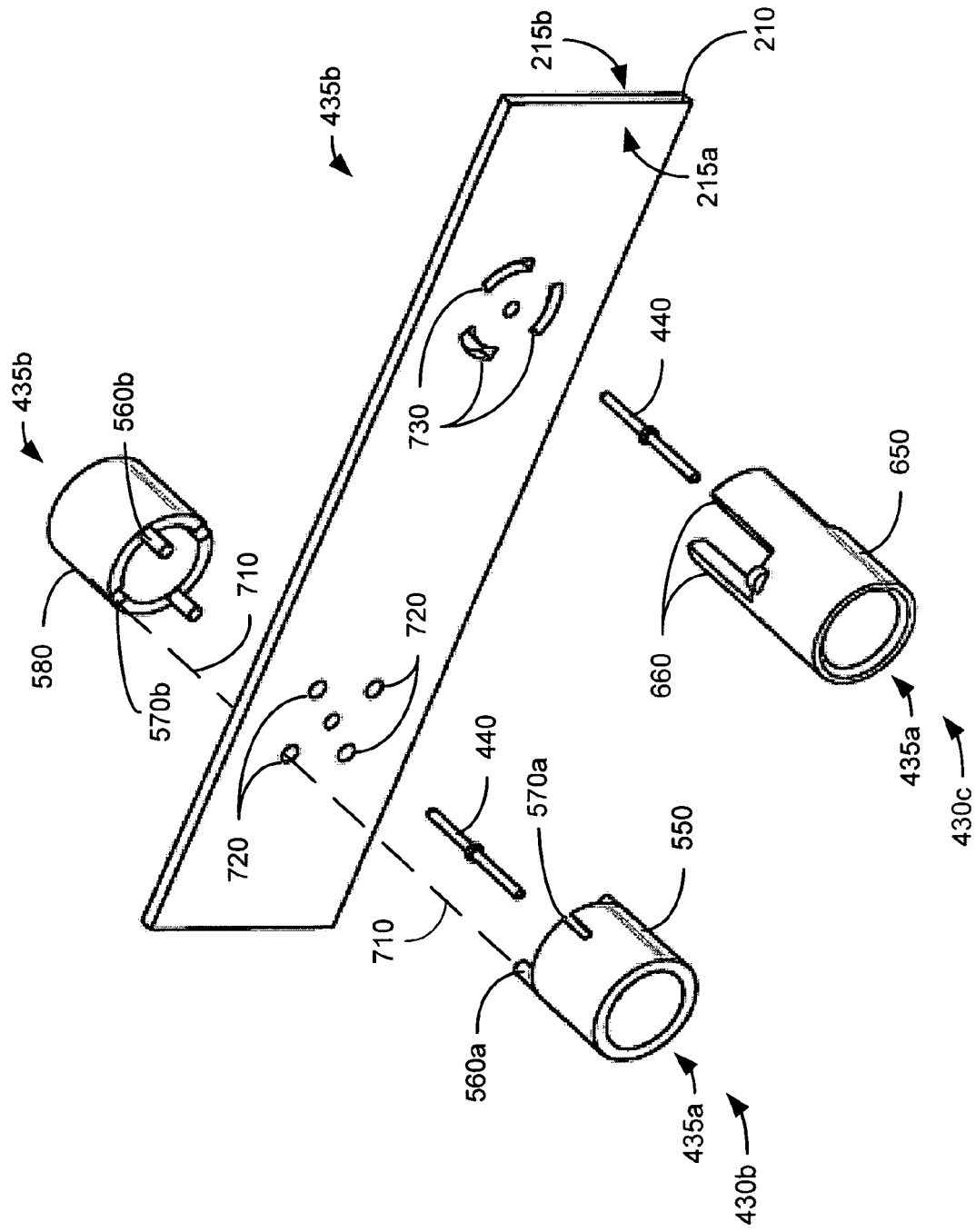
FIG. 7 is a perspective, exploded view of embodiments of exemplary multiple access test points similar to the embodiments from FIGS. 5 and 6.

FIG. 7 is a perspective, exploded view of exemplary multiple access test points similar to the embodiments from FIGS. 5 and 6. In at least one non-limiting embodiment, among others, the multiple access test point 430 may be configured to include a circuit connection and ground contacts on the first side 215a and/or second side 215b of a circuit board 210. As discussed in reference to the access test points of FIGS. 5 and 6, the circuit connection can include, but is not limited to, a connection pin 440 that is electrically connected to the circuit board 210 such that it extends from both the first side 215a and the second side 215b of the circuit board 210.

As discussed in reference to the access test point 430b of FIG. 5, in at least one non-limiting embodiment, among others, the ground contact on the first side 215a of the circuit board 210 may be provided using a first grounding can 550 configured with one or more legs 560a and slots 570a distributed around one edge of the grounding can 550. When electrically connected to the first side 215a of the circuit board 210, one or more legs 560a of the first grounding can 550 may be configured to extend through openings 720 in the circuit board 210 and protrude from the second side 215b. The ground contact on the second side 215b of the circuit board 210 may be provided by a second grounding can 580 with the same arrangement of one or more legs 560b and slots 570b described for the first grounding can 550. This second grounding can 580 may be electrically connected to the second side 215b of the circuit board 210 such that one or more legs 560b may extend through the openings 720 in the system circuit board 210 and protrude from the first side 215a into one or more slots 570a of the first grounding can 550. Similarly, one or more legs 560a of grounding can 550 may extend through the openings 720 in the system circuit board 210 and protrude into the slots 570b of the second grounding can 580 as illustrated by line 710. This arrangement of intermeshing legs 560 and slots 570 can provide continuity of the ground contacts on the first side 215a and second side 215b of the circuit board 210. While the illustrated non-limiting embodiment includes two legs 560 and two slots 570 evenly distributed on one side of ground cans 550 and 580, other implementations of legs and slots including, but not limited to, variations in size, distribution, number, form, and/or combinations thereof are possible.

In addition, in at least one non-limiting embodiment, among others, a first ground can 550 may include only slots 570a distributed around one edge. A second ground can 580 may include one or more legs 560b distributed around one edge such that the legs 560b can extend through the circuit board 210 and protrude into the slots 570a of the first ground can 550. Alternatively, the first ground can 550 may include one or more legs 560a distributed around one edge and the second ground can 580 may include only slots 570b distributed around one edge. Additionally, in at least one non-limiting embodiment, among others, both the first ground can 550 and the second ground can 580 may include only slots 570 distributed around one edge. In this non-limiting embodiment, legs separate from the ground cans, such as pins, tabs, etc., may be coupled to the circuit board 210 such that they protrude from the first side 215a and/or second side 215b of the circuit board 210. When the ground cans 550 and/or 580 are electrically connected to the circuit board 210, the separate legs protrude into the slots 570 of the first and/or second ground cans, 550 and/or 580, respectively. It should be emphasized that the above-described embodiments are merely possible examples of implementations, merely set forth for a clear understanding of the principles of this disclosure, and that other modifications and variations are intended to be included herein within the scope of this disclosure.

As discussed in reference to the access test point 430c of FIG. 6, in at least one non-limiting embodiment, among others, ground contacts may be provided on the first side 215a and/or second side 215b of the circuit board 210 using a grounding can 650 configured with a plurality of grounding extensions 660 distributed around one edge of the grounding can 650. When electrically connected to the first side 215a of the circuit board 210, the grounding extensions 660 of the grounding can 650 can extend through openings 730 and protrude from the second side 215b of the circuit board 210 to provide ground contact on the second side 215b. This arrangement of grounding extensions 660 can provide continuity of the ground contacts on the first side 215a and second side 215b of the circuit board 210. While the illustrated non-limiting embodiment includes three ground extensions 660 evenly distributed on one side of ground can 650, other implementations of ground extensions including, but not limited to, variations in size, distribution, number, form, and/or combinations thereof are possible.

As discussed in reference to the access test points of FIGS. 5 and 6, when the circuit board 210 is coupled to a module chassis 220 and disposed in an environmental housing 110 (illustrated in FIG. 1) such that the first side 215a faces the housing lid 120 and the second side 215b faces the housing base 130, a first side 435a of the multiple access test point 430 extends toward the housing lid 120 and a second side 435b of the multiple access test point 430 extends toward the housing base 130. The first side 435a of the multiple access test point 430 may be accessed when the housing lid 120 is open and/or via a test point access port 140 in the housing lid 120, when the lid 120 is closed. Access to the second side 435b of the multiple access test point 430 may be provided via an opening 590 through the module chassis 220 and a test point access port 140 in the housing base 130 that may be substantially aligned with the second side 435b of the test point 430.

Figure 8:
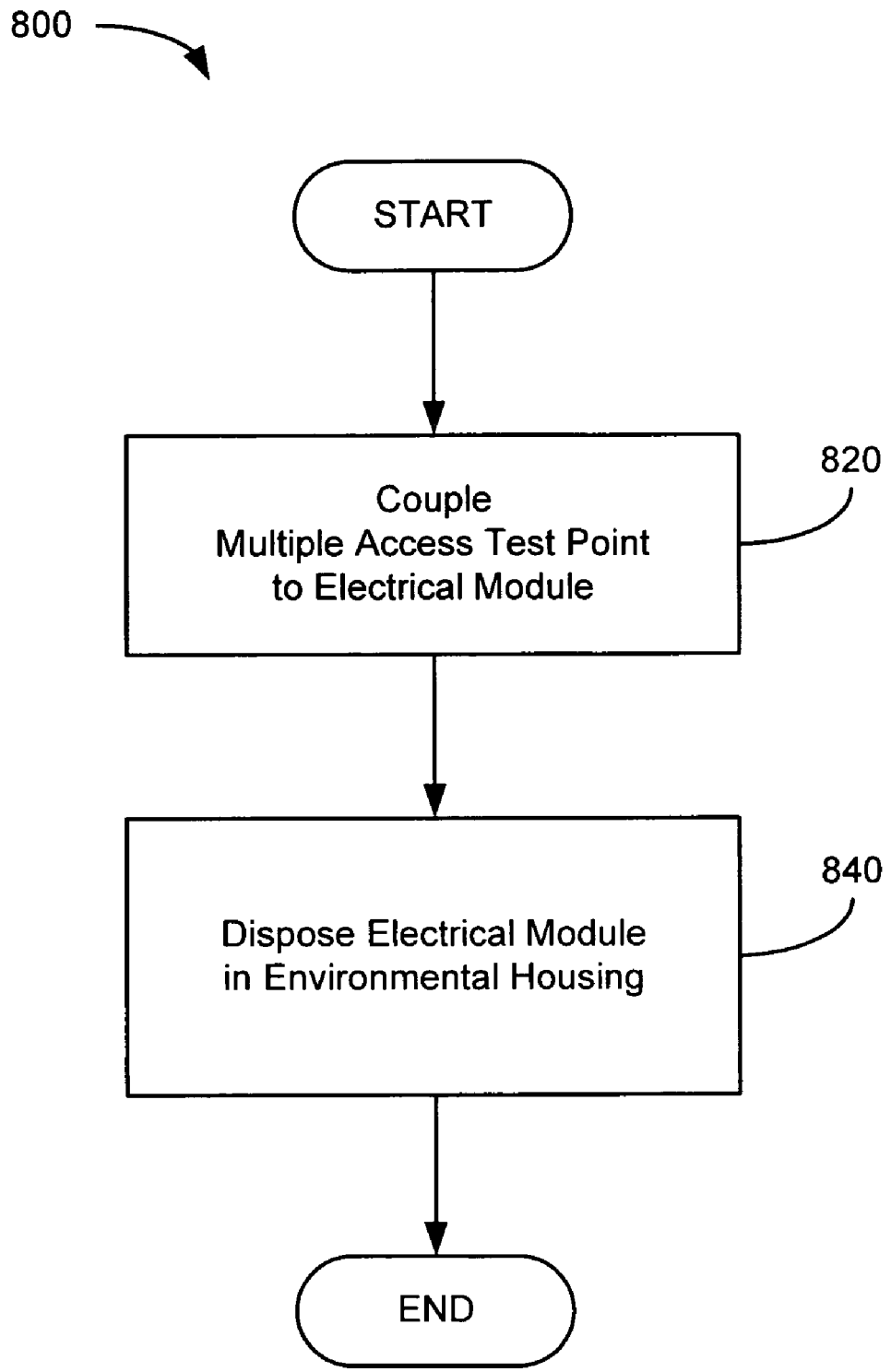
FIG. 8 is a flowchart illustrating an embodiment of an exemplary process for assembling an electrical unit such as the electrical unit of FIG. 1.

FIG. 8 is a flowchart 800 illustrating an embodiment of an exemplary process for assembling an electrical unit such as the electrical unit 100 of FIG. 1. As illustrated in block 820 of the non-limiting example of FIG. 8, at least one multiple access test point 430 may be coupled to an electrical module 150. While in at least one non-limiting embodiment, among others, coupling to the electrical module 150 can include electrically connecting one or more multiple access test points 430 to at least one circuit board 210 and coupling the circuit board 210 to a module chassis 220; this is not a requirement. The circuit board(s) 210 may then be coupled to one or more module chassis 220.

The electrical module 150 with test points 430 may also be disposed in an environmental housing 110 in block 840. The environmental housing 110 may include test point access ports 140 on the housing lid 120, housing base 130, and permutations thereof. The electrical module 150 may be installed such that at least one test point access port 140 is substantially aligned with at least one multiple access test point 430 to provide test probe access to the test point 430. In at least one non-limiting embodiment, among others, the electrical module 150 may be configured such that at least one test point access port 140 in the housing base 130 is substantially aligned with the second side 435b of at least one multiple access test point 430. The first side 435a of the multiple access test point 430 may be accessible when the housing lid 120 is open and/or via a test point access port 140 in the housing lid 120 that is substantially aligned with the test point 430 when the lid 120 is closed.

One should also note that conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

It should be emphasized that the above-described embodiments are merely possible examples of implementations, merely set forth for a clear understanding of the principles of this disclosure. Many variations and modifications may be made to the above-described embodiment(s) without departing substantially from the spirit and principles of the disclosure. All such modifications and variations are intended to be included herein within the scope of this disclosure.

Therefore, at least the following is claimed:

1. A system for providing access to test points, comprising:
   an electrical module including at least one electrical circuit, the electrical circuit configured to communicate at least one electrical signal, the electrical module further including a multiple access test point configured to provide access for measurements of the electrical circuit; and
   an environmental housing configured to enclose the electrical module the environmental housing comprising:
   a first access port located in the housing to provide access to the multiple access test point from outside the environmental housing; and
   a second access port located in the housing at a spaced apart location from the first access port to provide access to the multiple access test point from outside the environmental housing, the second access port being substantially coaxial with and located at an opposing side of the environmental housing relative to the first access port.

2. The system of claim 1, wherein the environmental housing includes a housing lid and a housing base.

3. The system of claim 2, wherein the first access port is located in the housing base and the second access port is located in the housing lid.

4. The system of claim 1, wherein the multiple access test point comprises:
   a circuit connection electrically connected to at least one electrical circuit;
   a first ground contact substantially aligned with the circuit connection; and
   a second ground contact substantially aligned with the circuit connection.

5. The system of claim 1, wherein the electrical module includes at least one circuit board configured to implement at least a portion of the electrical circuit, the circuit board further configured to include at least a first side and a second side.

6. The system of claim 5, wherein the multiple access test point is electrically connected to the circuit board.

7. The system of claim 6, wherein the multiple access test point includes:
   a connection pin configured to extend from the first side and the second side of the circuit board;
   a first ground contact located on the first side of the circuit board and substantially aligned with the connection pin; and
   a second ground contact located on the second side of the circuit board and substantially aligned with the connection pin.

8. The system of claim 7, wherein the second access port provides access to the second ground contact of the at least one multiple access test point.

9. A system for providing access to test points, comprising:
   a circuit board configured to facilitate operation of at least a portion of an electrical circuit, the circuit board including a first side and a second side;
   a chassis coupled to the circuit board;
   a connection pin configured to extend from the first side and the second side of the circuit board; and
   a ground contact electrically isolated from the connection pin having respective portions that extend from the first side and the second side of the circuit board and aligned substantially parallel with the connection pin, wherein the ground contact further comprises:
   a grounding can that circumscribes a first portion of the connection pin extending from the first side of the circuit board; and
   a plurality of extensions that extend through openings in the circuit board in a distributed relationship around a second portion of the connection pin extending from the second side of the circuit board.

10. The system of claim 9, wherein the chassis is configured to provide the ground contact.

11. The system of claim 9, wherein the chassis includes at least one opening to provide access to the ground contact.

12. A method for assembling an electrical unit including multiple access test points, comprising:
   coupling a multiple access test point to an electrical module; and
   disposing the electrical module in an environmental housing, the environmental housing comprising:
   a first access port located in the housing to provide access to the multiple access test point from outside the environmental housing; and
   a second access port located in the housing at a spaced apart location from the first access port to provide access to the multiple access test point from outside the environmental housing, the second access port being substantially coaxial with and located at an opposing side of the environmental housing relative to the first access port.

13. The method of claim 12, wherein coupling at least one multiple access test point to the electrical module comprises:
   electrically connecting the at least one multiple access test point to a circuit board; and
   coupling the circuit board to a module chassis.

14. The method of claim 13, further comprising electrically connecting the module chassis to a ground circuit of the circuit board.

15. The method of claim 13, wherein coupling the circuit board to the module chassis includes substantially aligning at least one ground contact for at least one multiple access test port with an opening in the module chassis.

16. The method of claim 12, wherein disposing the electrical module in the environmental housing includes substantially aligning the multiple access test point with the first and second access ports of the environmental housing.

17. A system for providing access to test points, comprising:
   a circuit board configured to facilitate operation of at least a portion of an electrical circuit, the circuit board including a first side and a second side;
   a chassis coupled to the circuit board;
   a connection pin configured to extend from the first side and the second side of the circuit board; and a ground contact having respective portions that extend from the first side and the second side of the circuit board and aligned substantially parallel with the connection pin,
   wherein the ground contact further comprises:
   a first grounding can comprising a plurality of legs and slots; and
   a second grounding can comprising a plurality of legs and slots;
   wherein, the first grounding can circumscribes a first portion of the connection pin extending from the first side of the circuit board, the second grounding can circumscribes a second portion of the connection pin extending from the second side of the circuit board; and
   wherein each of the plurality of legs of the first grounding can extends through an opening in the circuit board and into a corresponding slot of the second grounding can, and each of the plurality of legs of the second grounding can extend through an opening in the circuit board and into a corresponding slot of the first grounding can.

* * * * *